United States Patent [19]
Whitehead et al.

[11] Patent Number: 5,146,476
[45] Date of Patent: Sep. 8, 1992

[54] HIGH GAIN AMPLIFIER FOR RECEPTION OF LOW LEVEL PULSE CODE MODULATION NONRETURN-TO-ZERO SIGNALS

[75] Inventors: Joseph L. Whitehead, Decatur; Philip L. Dillon, Arlington, both of Tex.

[73] Assignee: Reliance Comm/Tec Corporation, Chicago, Ill.

[21] Appl. No.: 621,536

[22] Filed: Dec. 3, 1990

[51] Int. Cl.[5] .............................................. H04L 27/08
[52] U.S. Cl. ...................................... 375/98; 375/76; 307/359
[58] Field of Search ................... 375/76, 98; 328/173; 307/359; 330/278, 285; 358/464, 171, 174; 455/245

[56] References Cited

U.S. PATENT DOCUMENTS

| | | | |
|---|---|---|---|
| 3,688,205 | 8/1972 | Burger | 375/76 |
| 3,777,268 | 12/1973 | Cleobury et al. | 375/76 |
| 4,852,126 | 7/1989 | Tanaka et al. | 375/98 |
| 5,025,456 | 6/1991 | Ota et al. | 375/98 |

*Primary Examiner*—Stephen Chin
*Attorney, Agent, or Firm*—Michael M. Rickin

[57] ABSTRACT

An amplifier for use with low level pulse code modulation (PCM) nonreturn-to-zero (NRZ) signals. The amplifier has a high, but controllable gain and does not have a DC shift at its output as long as there is at least one zero or one one bit in each of frame PCM NRZ signals. The amplifier includes a feedback circuit to control the bias of one of the two stages of amplification when zeroes are being received. The amplifier also includes an AGC circuit which reduces the gain when a high amplitude one is received.

17 Claims, 2 Drawing Sheets

HIGH GAIN AMPLIFIER FOR RECEPTION OF LOW LEVEL PULSE CODE MODULATION NONRETURN-TO-ZERO SIGNALS

BACKGROUND OF THE INVENTION

1. Field of the Invention

This invention relates to the recovery of asymmetrical binary signals and specifically to the amplification of such signals from a very low level to a voltage and power level acceptable to digital circuitry.

2. Description of the Prior Art

In the past, it has been necessary to use DC coupled amplifiers to amplify pulse code modulation (PCM) nonreturn-to-zero (NRZ) signals because of the varying duty cycle of the pulses. The varying duty cycle results from the fact that the signal does not return to zero between consecutive ones. There is, however, an advantage in using this form of transmission because it conserves bandwidth.

AC coupled amplifiers can be made more sensitive than DC amplifiers because they can be designed with high gain, and stabilized with a DC feedback loop that does not reduce their gain to the AC component. The disadvantage of AC coupled amplifiers is that they exhibit what is known as DC shift when the signals they are amplifying are not symmetrical. That is, there will be a false DC component in the output of an AC coupled amplifier that is relative to the average level of the signal seen at the input. This would be unacceptable in a digital receiver in that it would cause errors in the decision making circuit (usually a voltage comparator) that interfaces the amplifier to the digital circuitry.

In view of the unacceptable false DC component which results from the use of an AC coupled amplifier, consideration has been given to the use of high gain DC amplifiers for PCM NRZ signals. Such amplifiers are, however, very difficult to stabilize because slight variations in bias currents, due to changes in temperature and component aging, are greatly amplified. Feedback cannot be used in a conventional DC coupled amplifier for stabilization without correspondingly reducing the gain to the desired DC component.

Bipolar transmission, and other schemes that condition the signal so that its duty cycle is 50% have been employed so that AC coupled amplifiers could be used. In a low power fiber optic system, however, bipolar transmission is not practical and other schemes require extra bandwidth, which places its own demands on the system power budget. Therefore, in designing such a low power fiber optic system, the PCM NRZ format was chosen for transmission of the information.

The amplifier described herein was designed for use in the low power fiber optic system described above. The amplifier has the high gain and stability of an AC coupled amplifier and yet can accommodate wide variations in duty cycle without suffering from DC shift. There is a limit to the maximum pulse width it can sustain before DC shift sets in, but that limit is adjustable. In the embodiment herein described, the limit is greater than one frame of the bit stream. Therefore, as long as there is at least one zero bit per frame all of the other bits in the frame can be ones without evidence of DC shift.

SUMMARY OF THE INVENTION

An amplifier for received PCM NRZ signals. The amplifier includes controllable gain means for amplifying the received signals. It also includes first control means which responds to the amplified received signals for operating in a first mode when zeroes bits are in the received signals to control the DC drift of the amplifying means and for operating in a second mode when ones bits are in the received signals for controlling the amplifying means to have minimal DC shift for the received ones bits.

The amplifier further includes a second means which responds to the amplified received PCM NRZ signals for decreasing the amplifying means controllable gain so that the amplified received PCM NRZ signals have essentially a constant output level when ones bits having an amplitude above a predetermined threshold are in the received signals.

DESCRIPTION OF THE PREFERRED EMBODIMENT

Figure 1:
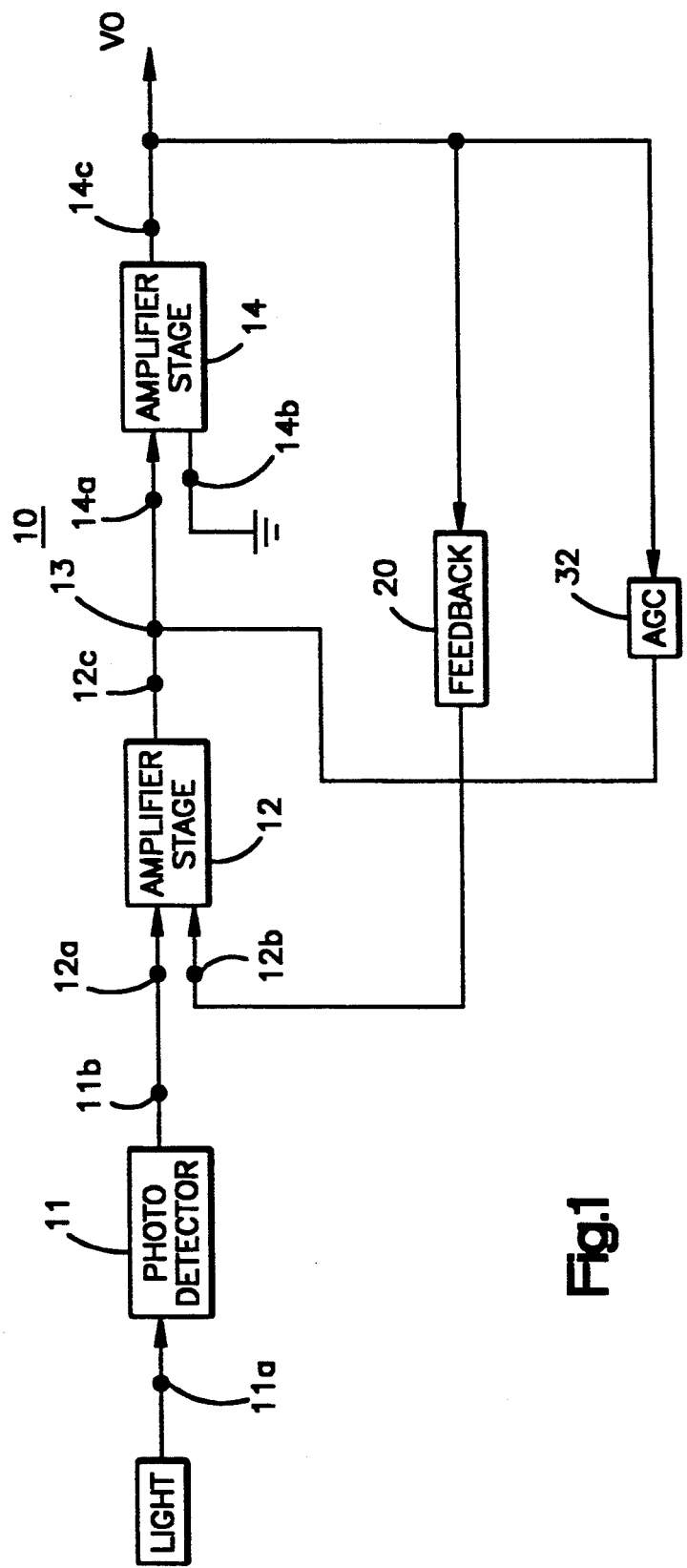
FIG. 1 shows a block diagram for one embodiment of the high gain amplifier of the present invention.

Referring now to FIG. 1, there is shown a block diagram for one embodiment of the high gain amplifier 10 of the present invention. Amplifier 10 may be used in the receiver of a low power fiber optic system which uses the PCM NRZ format for the transmission of information. Signals in the form of light are carried on an optical fiber from one end of the system to the other end. The receiver then includes suitable means such as a photodetector 11 to convert the received light into an electrical signal.

Light received from an optical fiber (not shown) at the input 11a of photodetector 11 is converted into an electrical signal at the output 11b of the photodetector. When the photodetector is illuminated by light carried on the optical fiber, a current will flow at the output 11b. The amplitude of that current flow is directly proportional to the optical power which illuminates the photodetector. That current will be referred to hereinafter as the "signal current".

Amplifier 10 includes first and second stages of amplification 12 and 14, respectively. Each of stages 12 and 14 functions as a differential amplifier having two inputs. The output 11b of the photodetector is connected to input 12a of stage 12. The other input 12b to stage 12 is connected to the output of feedback circuit 20 whose function will be described below. The output 12c of stage 12 is connected to one input 14a of stage 14. The output of AGC circuit 32, whose function will be described below, is connected between the output of stage 12 and input 14a to stage 14 at junction 13. The other input 14b to stage 14 is connected to ground. The output 14c of that stage is connected to the output VO of amplifier 10. The input to each of circuits 20 and 32 are connected to output VO.

Amplifier 10 must meet two requirements for use in the low power fiber optic system. It must have both a high gain and not distort the amplified pulses appearing at its output. While the optical power in that system is quite low, the amplitude of the signal at the output VO must be at a level typically useable by the electronic circuitry (not shown) to which that output is connected. The electronic circuitry may use the amplified pulses as a clock signal and any distortion appearing in those pulses is undesirable. In addition, that circuitry will convert the amplified pulses into true digital signals. As is well known the received PCM NRZ signals are not necessarily true digital signals as they may be distorted during transmission.

In order to meet the above requirements the gain of amplifier 10 must not only be high but also controllable. The control ensures that received one bits having an amplitude above a predetermined threshold are not distorted at the amplifier output, i.e. the amplifier output is held at a constant level for such one bits, as long as there is at least one one bit in each of the frames whose amplitude is above the threshold. Amplifier 10 also must have minimal DC shift at output VO for received one bits as long as there is at least one zero bit in each of the frames of the PCM NRZ signals used in the low power fiber optic system. In addition, amplifier 10 also must not have any DC drift at its output when zero bits are received, i.e. the amplifier is stabilized. This ensures that when one bits are received, the amplitude of the voltage at the amplifier output moves to the positive peak without clipping.

As stated above, amplifier 10 must have a controllable high gain, no DC drift and a minimal DC shift at VO. Amplifier stage 12 is designed to have both a fast rise time in order to avoid distorting the digital signals at its input and a substantial gain. Amplifier stage 14 provides the additional gain needed to meet the overall high gain requirement imposed on amplifier Because of the high gain of amplifier 10, any small change at the input to the amplifier would, absent any control on the DC drift of the amplifier, cause the output at VO to reach either the upper or lower limit imposed on VO. The control which prevents that from happening is provided by feedback circuit 20 which controls the bias of stage 12.

Feedback circuit 20 functions in a closed loop mode of operation to control the bias of stage 12. The circuit provides closed loop bias control for amplifier 10 when there isn't any light on the optical fiber of the transmission system to illuminate the photodetector 11. In other words, circuit 20 is operative to provide closed loop feedback when "zeroes" are being transmitted on the optical fiber from the other end of the transmission system. This closed loop bias control ensures that amplifier 10 does not have any DC drift.

When light is received at the photodetector 11, i.e. the other end of the transmission system is transmitting "ones", the connection of feedback circuit 20 to VO is broken. The closed loop is opened. That connection is reestablished upon the receipt of the next zero. Therefore, circuit 20 provides only passive bias control from energy stored when the loop is closed when one or more ones are received at the input 12a to amplifier stage 12. This passive bias control ensures that amplifier 10 does not have any DC shift for received ones.

In contrast to the above described operation of feedback circuit 20, AGC circuit 32 is operative when a high amplitude one is present at the input 12a to stage 12. As will be described in more detail in connection with the circuit schematic of FIG. 2, circuit 32 functions to reduce the gain of amplifier stage 12 when ones above a certain threshold are received at the input to amplifier 10. This reduction in gain is necessary to prevent the amplified pulses appearing at VO from becoming distorted when ones above a certain threshold, i.e. high amplitude ones, are received at the input to the amplifier. The fact that ones may have a high signal level may give rise to distortion in the output pulses.

In summary, feedback circuit 20 provides closed loop bias control for amplifier 10 when zeroes (negative peaks) are received at the amplifier input and passive bias control from energy stored when the loop is closed when ones are received at the input. AGC circuit provides gain control for the amplifier when ones above a certain threshold (positive peaks) are received at the input to the amplifier. Bias control is necessary because of the high gain requirements imposed on the amplifier, while gain control is necessary to avoid distortion in the signal at the amplifier output when high amplitude ones are received at the amplifier input. Circuits 20 and 32 each provide the above described control when amplifier 10 is stabilized, i.e. in its steady state operating mode. That mode will be described in more detail in connection with FIG. 2 wherein the operation of amplifier 10 when power is first applied to it will first be described. It will be seen from that description that feedback circuit 20 includes a negative peak detector as it provides closed loop bias control for zeroes, while AGC circuit 32 includes a positive peak detector as it provides gain control for high amplitude ones.

Figure 2:
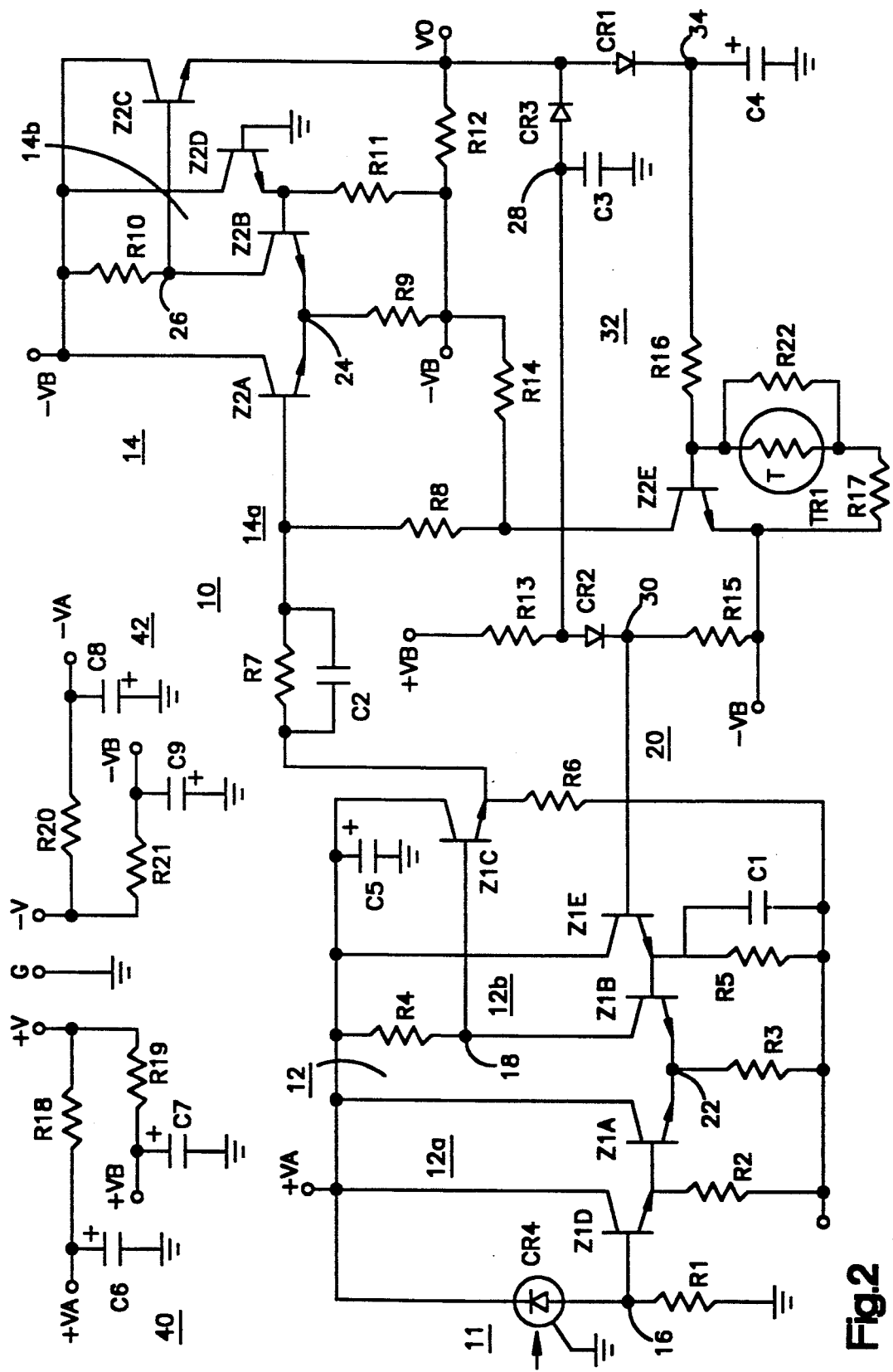
FIG. 2; shows a schematic circuit diagram for the embodiment of FIG. 1.

Referring now to FIG. 2, there is shown a schematic circuit diagram for amplifier 10. Photodetector 11 includes photodiode CR4 which has its cathode connected to a source of voltage +VA and its anode connected to ground through a resistor R1. The diode is reverse biased and when illuminated will allow the signal current to flow from +VA to ground. The amplitude of the signal current is directly proportional to the optical power with which the diode is illuminated.

In one embodiment for the low power fiber optic system in which the diode CR4 was used, the responsivity of the diode was 0.6 amps/watt. As the optical power in the system is measured in microwatts, the above responsivity gives rise to a signal current of 0.6 microamps flowing in resistor R1 when the fiber carries one microwatt of optical power. In that same embodiment, the dynamic range of the optical system is from −26 dBm to −46 dBm which results in a signal current flowing through resistor R1 in the range from 1.5 microamps at −26 dBm to 0.015 microamps at −46 dBm.

As described in connection with FIG. 1, amplifier 10 includes first and second stages of amplification 12 and 14, respectively. Stage 12, which includes transistors Z1D, Z1A, Z1B and Z1E, functions as a differential amplifier. As will be described in more detail below, stage 12 compares the signal current at the base of transistor Z1D to a reference current at the base of transistor Z1E. Stage 14, which includes transistors Z1C, Z2A, Z2B and Z2D, also functions as a differential amplifier. As will also be described in more detail below, stage 14 compares the signal currents at the base of transistor Z1C with the ground level at the base of transistor Z2D.

The junction 16 of the anode of diode CR4 and resistor R1 is connected to the base of transistor Z1D which is the input to amplifier 10. The collector of transistor Z1D is directly connected to the source of voltage +VA. The emitter of transistor Z1D is connected by a resistor R2 to a source of voltage −VA and directly to the base of transistor Z1A. The collector of transistor Z1A is connected directly to +VA while the emitter of transistor Z1A is connected by resistor R3 to −VA. Transistors Z1D and Z1A are arranged in the well-known Darlington configuration.

The emitter of transistor Z1A is connected directly to the emitter of transistor Z1B at junction 22. The emitter of transistor Z1B is also connected by resistor R3 to −VA. The collector of transistor Z1B is connected by a resistor R4 to +VA. The junction 18 of resistor R4 and the collector of transistor Z1B (which may be thought of as the unbuffered output of stage 12) is connected directly to the base of transistor Z1C. Transistor Z1C is connected in the well known emitter follower configuration and therefore functions to buffer the output of stage 12. It also functions as the input for stage 14.

Since transistor Z1C is in the emitter follower configuration, the A-C voltage at the emitter of the transistor is the same as the A-C voltage at junction 18 except that voltage "sees" a lower source impedance at the transistor's emitter. A positive going voltage at the collector of transistor Z1B, which is connected to junction 18, is then reproduced by transistor Z1C with a current gain. This ensures that there is sufficient power at the input to stage 14 to drive that stage.

The base of transistor Z1B is connected to the emitter of transistor Z1E. The emitter of transistor Z1E is also connected by the parallel combination of a resistor R5 and a capacitor C1 to −VA. The collector of transistor Z1E is connected directly to +VA. The base of Z1E is connected to receive a signal from feedback circuit 20 whose embodiment will be described in more detail below. Transistors Z1B and Z1E are also arranged in the well-known Darlington configuration.

Transistor Z1D functions as the noninverting input 12a of differential amplifier stage 12, while transistor Z1E functions as the inverting input 12b of that stage. Transistor Z1D amplifies the signal current and thus controls the base current of transistor Z1A. The transistors Z1A and Z1B have their emitters coupled together at junction 22 and therefore compete with each other for current.

When an optical pulse is received at diode CR4, the base current of transistor Z1D increases. This increase in current is amplified so that the increase of the current in transistor Z1A is many times the increase of the base current of transistor Z1D. Since transistors Z1A and Z1B compete with each other for current, the increase in current in transistor Z1A causes a corresponding decrease in the current in transistor Z1B. That decrease results in a positive going voltage at the collector of the transistor Z1B.

The bias on transistor Z1E is equal to that of transistors Z1D and Z1A in order that the two halves 12a, 12b (transistors Z1D/Z1A and Z1B/Z1E, respectively) of the differential amplifier stage 12 are balanced. Input bias current to the two halves is supplied from −VA to ground through the resistor R3 to the junction 22 of the emitters of the transistors Z1A and Z1B. At junction 22 the input bias current divides equally between the two halves of stage 12 when zeroes are received at the amplifier input. Most of the input bias current will be the collector currents of transistors Z1A and Z1B. A small portion of that current will be the base current of transistor Z1A. An even smaller portion of that current will be the base current of transistor Z1D. The base of that transistor is connected to ground by resistor R1.

At the transistor Z1E the base current is controlled by the feedback circuit 20, in the manner to be described below, so that the base current matches the current at transistor Z1D when there isn't any signal current. The equal input bias currents to halves 12a and 12b and the control provided by circuit 20 described directly above both occur when zeroes are received at the input to amplifier 10 and in combination act to balance the halves. Balancing the halves when zeroes are received ensures that the gain of stage 12 and therefore amplifier 10 is kept at its desired high level.

Transistor Z1C has its collector connected to +VA and its emitter connected by a resistor R6 to −VA. The emitter of transistor Z1C is also connected by the parallel combination of resistor R7 and capacitor C2 to the base of transistor Z1A. As previously described, transistor Z1C functions as a buffer for the output of first differential amplifier stage 12 and also as the Darlington input for the second differential amplifier stage 14. That stage also includes two halves 14a, 14b with transistors Z1C and Z2A forming half 14a and transistors Z2B and Z2D forming half 14b.

Amplifier stage 14 operates in the same manner as amplifier stage 12. The only difference is that in stage 14 the input signals at the base of transistor Z1C (the noninverting input of the stage) are compared to the ground level which appears at the base of transistor Z2D (the inverting input of the stage). In stage 14 the junction 24 of the emitters of transistors Z2A and Z2B is connected by a resistor R9 to a source of voltage −VB, which it should be noted is different from the voltage source −VA to which the junction 22 of the emitters of transistors Z1A and Z1B is connected. The emitter of transistor Z2D is connected by a resistor R11 to −VB.

The collectors of transistors Z2A and Z2D are connected directly to a source of voltage +VB while the collector of transistor Z2B (which may be thought of as the unbuffered output of stage 14) is connected by a resistor R10 to +VB. It should also be noted that voltage source +VB is not the same as the voltage source +VA to which the collectors of transistors Z1D, Z1A, Z1E and Z1C are connected. The junction 26 of the collector of transistor Z2B and resistor R10 is connected to the base of a transistor Z2C. The collector of transistor Z2C is connected to +VB while the emitter of that transistor is connected to the output VO of circuit 10. Therefore, transistor Z2C functions to buffer the voltage at the collector of transistor Z2B to the output VO of amplifier 10.

As previously discussed, prior art high gain DC amplifiers are very difficult to stabilize because slight variations in bias currents, due to changes in temperature and component aging, are greatly amplified. Also, as previously discussed, feedback cannot be used in a conventional prior art DC coupled amplifier for stabilization without a corresponding reduction in gain to the desired DC component. In the DC coupled amplifier 10 of the present invention, closed loop feedback is used to control the amplifier bias to thereby stabilize the amplifier against DC drift due to temperature changes, component aging, etc. without a corresponding reduction in gain. In amplifier 10 the feedback circuit functions in a passive manner from energy stored when the loop is closed such that if the system is transmitting "ones" from the other end, the amplifier does not have any shift to DC. In other words, the output of the amlifier would be the level of the ones.

The embodiment shown in FIG. 2 for the feedback circuit 20 of amplifier 10 will now be described. In this description it is assumed that the amplifier is powered up and that there isn't any signal current present in the amplifier. In other words, there isn't any light on the fiber of the transmission system to illuminate diode CR4, i.e. only "zeroes" are being transmitted on the fiber from the other end of the system when the amplifier is powered up.

The transistor Z1C is forward biased because its base is connected by resistor R4 to +VA. The emitter of transistor Z1C then goes positive. As the emitter is connected by the parallel combination of resistor R7 and capacitor C2 to the base of transistor Z2A that transistor turns on which turns off transistor Z2B. With transistor Z2B off, the collector of that transistor is at the voltage +VB. The output VO of the amplifier is connected to the collector of transistor Z2B through the base-emitter junction of transistor Z2C. Therefore, the voltage at VO will be one junction, i.e. diode, drop below +VB.

The output VO is connected to the base of transistor Z1E by feedback circuit 20. Circuit 20 includes a diode CR3 whose cathode is connected to VO and whose anode is connected to a junction 28. A capacitor C3 is connected between junction 28 and ground. A resistor R13 is connected between junction 28 and +VB. A diode CR2 has its anode connected to junction 28 and its cathode connected at junction 30 to the base of transistor Z1E and to the voltage −VB by a resistor R15.

When the voltage at VO is one diode drop below +VB, the diode CR3 is reverse biased and nonconductive. Feedback circuit 20 provides open loop control for the bias of stage 12. With diode CR3 nonconductive the capacitor C3 can then charge through the resistor R13 from the voltage source +VB. The time constant associated with the charging of capacitor C3 through resistor R13 is selected so that the capacitor charges relatively slowly through the resistor. Therefore, the voltage across capacitor C3 slowly increases from zero towards +VB. When the voltage across capacitor C3 reaches a predetermined positive amplitude the transistor Z1E begins to turn on. The turning on of transistor Z1E causes transistor Z1B to turn on. The turning on of transistor Z1B causes the collector of that transistor which is connected to the base of transistor Z1C to become less positive than it previously was. In other words, the amplitude of the voltage at junction 18 decreases.

As described above, transistor Z1C was initially forward biased through resistor R4. The turning on of transistor Z1B reduces the forward bias at transistor Z1C. That reduction in forward bias of transistor Z1C causes the voltage at VO to become less positive, i.e. the voltage at VO which initially was one diode drop below +VB reduces its amplitude, so that it is more than one diode drop below +VB.

As a result of the charging of capacitor C3, the diode CR3 has a positive going voltage at its anode which is connected to junction 28. The cathode of diode CR3 is connected to VO and as the voltage at VO is now becoming less positive, a negative going voltage appears at the CR3 cathode. Therefore, at some point in time, diode CR3 will become forward biased and begin to conduct. When that occurs, feedback circuit 20 will provide closed loop control for the bias of stage 12. The going into conduction of diode CR3 acts as a clamp for the voltage on capacitor C3.

As previously described, diode CR2 is included in feedback circuit 20 and as can be seen from the figure, it is connected in back-to-back relationship with diode CR3, i.e. the anodes of the two diodes are connected to each other. Therefore, the voltage drop across diode CR2 will cancel the voltage drop across diode CR3. This cancellation means that with amplifier 10 powered up and stabilized, and without any signal current present in the amplifier, the voltage at the base of transistor Z1E should be the same as the voltage at VO. The voltage at VO should be the same as the voltage at the input to amplifier 10 as the DC gain from input 12a to output VO is unity as long as diode CR3 conducts. In other words, there isn't any attenuation in feedback circuit 20 when it provides closed loop bias control.

It should be appreciated from the above description that the diode CR3 is reverse biased when the voltage at VO is becoming more positive. The voltage at VO becomes more positive when "ones" are received at photodiode CR4 from the other end of the system. The resistance of resistor R13 and capacitance of capacitor C3 are selected to give a very long time constant such that the capacitor cannot charge very fast through resistor R13. The diode CR3 then remains reverse biased during the positive voltage excursions at VO. Therefore, for a long string of "ones" received at photodiode CR4, the voltage at VO is high in amplitude, diode CR3 is off and capacitor C3 charges slowly through resistor R13.

Since the closed loop operating mode of feedback circuit 20 is actuated only when CR3 conducts there isn't any closed loop feedback in amplifier 10 when one or more ones are received at photodiode CR4. There is, however, passive bias control to ensure minimal DC shift to received ones when one or more ones are received after amplifier 10 has stabilized. If a long string of ones are received at the photodiode, the slowly increasing charge on capacitor C3 will eventually reach a level that will cause the feedback loop to close. Amplifier 10 would then have unity DC gain for ones and undesirable DC shift would occur. The number of ones that can be consecutively received before the charge on the capacitor increases to the point where the feedback loop closes and therefore the maximum time that the amplifier has minimal DC shift for ones, i.e. the maximum ones pulse width, can be controlled by the resistance chosen for resistor R13 and/or the capacitance chosen for capacitor C3.

In one embodiment for amplifier 10, the resistance of resistor R13 was selected to be 332K ohms and the capacitance for capacitor C3 was selected to be 2.2 microfarads. This gave rise to a time constant of about 0.73 seconds. In the low power fiber optic system in which amplifier 10 was used, this time constant is sufficient to ensure that there is minimal shift at the output VO as long as there is at least one zero bit in each received frame.

It should further be appreciated that when one or more zeroes are received at photodiode CR4, the voltage at VO becomes less positive. When one or more ones are received at the photodiode, diode CR3 was nonconductive. During the receipt of ones the amplitude of the voltage on the capacitor increases slowly through resistor R13. When a zero is received after amplifier 10 has received one or more ones, the diode CR3 conducts and the voltage on the capacitor rapidly returns to the level it had when zeroes were last received.

As described above the maximum ones pulse width for which amplifier 10 has minimal DC shift for ones can be controlled by the resistance chosen for resistor R13 and/or the capacitance chosen for cpacitor C3. In the embodiment being described herein that limit is greater than the time for one frame. As long as there is at least one zero in every frame, amplifier 10 will always have minimal DC shift for the ones received in each frame. Diode CR3 and capacitor C3 can be viewed as a negative peak detector which stores the most negative excursions of the voltage at VO for use as a control signal in the opend loop operating mode of feedback circuit 20.

As earlier described, amplifier 10 may be used in a low power fiber optic system which has an optical dynamic range from −26 dBm to −46 dBm. Therefore, amplifier 10 is required to have an optical dynamic range of 20 dB. Also as earlier described, the signal current in photodiode CR4 is proportional to the optical power received at the diode. As is well known, electrical power is proportional to the square of the current. Thus amplifier 10 must have an electrical dynamic range of 40 dB in order to be used in the low power fiber optic system.

In order to meet the above requirement amplifier 10 includes automatic gain control (AGC) circuit 32. Circuit 32 which comprises transistor Z2E, diode CR1, capacitor C4, resistors R7, R8, R16, R17 and R22 and thermistor TR1 functions to control the gain of the first amplifier stage 12 when ones are received at photodiode CR4. As previously described in connection with FIG. 1, this gain control is necessary in order to avoid distortion to the pulses appearing at VO when high amplitude ones are received at the photodiode. The peak voltage at the collector of transistor Z1B depends on the amplitude of the ones that are received at the photodiode.

Without the gain control provided by circuit 32, transistor Z1B will go into saturation when the amplitude of the received ones are above the threshold. The threshold is dependent upon the resistance selected for resistors R16, R17, R22 and thermistor TR1. Should transistor Z1B go into saturation, its fall time would be quite long. When the next zero is received at the photodiode, the long fall time of transistor Z1B would not allow the voltage corresponding to that zero to appear at VO. In other words, the voltage at VO would not be an accurate amplified electrical reproduction of the pulses transmitted on the optical fiber. Therefore, it is necessary to control and reduce the gain of stage 12 after several such high amplitude ones have been received so that the voltage at VO is an accurate amplified electrical reproduction of the pulses received at the photodiode.

Diode CR1 and capacitor C4, which are connected in series between output VO and ground, functions as a positive peak detector to store in capacitor C4 the most positive excursions of the output of amplifier 10. As described above in connection with feedback circuit 20, those excursions occur when ones above the threshold are received at photodiode CR4. Therefore, the voltage across capacitor C4 depends on the number of such ones received at the photodiode, i.e. the signal strength at the input to amplifier 10.

The resistor R16, which is connected between the base of transistor Z2E and the junction 34 of diode CR1 and capacitor C4, and R17 and R22 along with thermistor TR1, all of which are connected between the base and emitter of transistor Z2E, determine a threshold at which transistor Z2E will begin to conduct. In order for circuit 32 to control the gain of amplifier stage 12, transistor Z2E must be conductive. To be conductive transistor Z2E must be forward biased. That bias is supplied by the voltage across capacitor C4.

As described above, the amplitude of the voltage across capacitor C4 depends on the signal strength at the input to amplifier 10. When high amplitude ones are received at the photodiode, the voltage across capacitor C4 increases as capacitor C4 rapidly charges through diode CR1 towards the positive peak of the signal VO. After several such ones are received, the voltage on capacitor C4 reaches a voltage equal to the positive peak minus the drop across diode CR1 and is high enough to forward bias transistor Z2E. The AGC circuit can then control the gain of stage 12.

When a zero is received, diode CR1 becomes nonconductive and capacitor C4 begins to discharge through resistor R16. The resistance of that resistor is selected so that the capacitor cannot rapidly discharge even for a long string of zeroes. Therefore, as long as there is at least one high amplitude one in each frame the voltage on the capacitor rapidly returns to one diode drop below the positive peak when the next one is received. It should be appreciated that since capacitor C4 cannot rapidly discharge when a zero is received that the high amplitude ones referred to above need not be consecutive in order for the capacitor to first charge to its maximum voltage.

The control of the gain of amplifier stage 12 provided by AGC circuit 32 is not direct. AGC circuit 32 controls the gain of amplifier stage 12 through feedback circuit 20. It does that by manipulating the feedback circuit 20 to correct what is a false error. In other words, AGC circuit 32 causes feedback circuit 20 to sense a false error which the feedback circuit then corrects in a manner which controls the gain of amplifier stage 12. How that happens is described below.

The collector of AGC transistor Z2E is connected to the base of transistor Z2A by resistor R8. When transistor Z2E begins to conduct some of the bias current for transistor Z2A is stolen away from the base of that transistor by resistor R8. This loss of bias current would cause the base of transistor Z2A to become more negative, but for the operation of feedback circuit 20. Feedback circuit 20 compensates for that loss of bias current at transistor Z2A by forcing transistor Z1C to supply the missing current. Therefore, the base of transistor Z2A does not become more negative.

In that same one embodiment for amplifier 10 described above for resistor R13 and capacitor C3 the following resistances were selected for resistors R16, R17, R23 and thermistor TR1:

R16=143K ohms
R17=15K ohms
R22=10K ohms
TR1=2K ohms at room temperature.

Those resistances gave rise to a threshold of −38 dBm optical.

In supplying that missing current the emitter of transistor Z1C must become more positive. The emitter of transistor Z1C is connected to the base of transistor Z2A by resistor R7. It is this resistor which provides the voltage drop that allows the emitter of transistor Z1C to become more positive. In order for the feedback circuit to force transistor Z1C to supply the current which compensates for the lost bias current at transistor Z2A the feedback circuit reduces the current in transistors Z1E and Z1B. It is the reduction of the current in transistor Z1B which lowers the gain of amplifier stage 12. The amount by which the gain of stage 12 is lowered depends on the amplitude of the ones that have been received. As more high amplitude ones are received, transistor Z2E becomes more conductive which increases the false error that circuit 20 must correct by reducing the gain of stage 12.

Thermistor TR1 has a negative temperature coefficient. It is used in the circuit to provide forward bias to transistor Z2E. The photodiode CR4 has increased efficiency as the temperature decreases. The short-circuit current gain of transistor Z2E decreases as the temperature decreases. The negative temperature coefficient of thermistor TR1 causes the resistance of the thermistor to increase as the temperature decreases which increases the forward bias of transistor Z2E. This increase of forward bias with decreasing temperature compensate both for the increased efficiency of the photodiode and for the decreased short-circuit current gain of transistor Z2E as the temperature decreases.

As can be seen from FIG. 2, the voltages +VA and −VA are associated with stage 12, while the voltages +VB and −VB are associated with stage 14. The voltages +VA and +VB are generated from the voltage +V by the power supply network 40 consisting of resistors R18 and R19 and capacitors C6 and C7. The voltages −VA and −VB are generated from the voltage −V by the power supply network 42 consisting of resistors R20 and R21 and capacitors C8 and C9. The networks 40 and 42 are identical but separate from each other and this ensures that there isn't any coupling between stages 12 and 14 through the power supply networks. Such coupling is undesirable as it may produce regenerative feedback in the amplifier. The capacitors C6, C7, C8 and C9 each provide separate filters for their associated power supply network output voltages.

It is to be understood that the description of the preferred embodiment is intended to be only illustrative, rather than exhaustive, of the present invention. Those of ordinary skill will be able to make certain additions, deletions, and/or modifications to the embodiment of the disclosed subject matter without departing from the spirit of the invention or its scope, as defined by the appended claims.

What is claimed is:

1. An amplifier for received pulse code modulation nonreturn-to-zero (PCM NRZ) signals comprising:
   a) means having a controllable gain for amplifying said received PCM NRZ signals;
   b) first means responsive to the amplified received PCM NRZ signals for:
      i) operating in a first mode when zeroes bits are in said received PCM NRZ signals to control the DC drift of the amplifying means; and
      ii) operating in a second mode when ones bits are in said received PCM NRZ signals for controlling the amplifying means to have minimal DC shift for said received ones bits; and
   c) second means responsive to the amplified received PCM NRZ signals for decreasing the amplifying means controllable gain so that said amplified received PCM NRZ signals have essentially a constant output level when ones bits having an amplitude above a predetermined threshold are in said received PCM NRZ signals.

2. The amplifier of claim 1 wherein said PCM NRZ signals are received in frames and said first means operating in said second mode ensures that said amplifying means has said minimal DC shift as long as there is at least one zeroes bit in each of said frames.

3. The amplifier of claim 1 wherein said PCM NRZ signals are received in frames and said second means decreases said controllable gain as long as there is at least one ones bit in each of said frames whose amplitude is above said predetermined threshold.

4. The amplifier of claim 1 wherein said PCM NRZ signals are received in frames and wherein:
   i) said first means operating in said second mode ensures that said amplifying means has said minimal DC shift as long as there is at least one zeroes bit is in each of said frames; and
   ii) said second means decreases said controllable gain as long as there is at least one ones bit in each of said frames whose amplitude is above said predetermined threshold.

5. The amplifier of claim 1 wherein said first means includes means for determining the number of consecutive ones bits in said received PCM NRZ signals for which said amplifying means has minimal DC shift.

6. The amplifier of claim 5 wherein said PCM NRZ signals are received in frames and said means for determining said predetermined number of consecutive ones bits in each of said frames is set to be one less than the total number of bits in each frame.

7. The amplifier of claim 1 wherein said PCM NRZ signals are received in frames and said second means includes means requiring at least one ones bit in each of said frames whose amplitude is above said predetermined threshold for said second means to decrease said controllable gain.

8. The amplifier of claim 1 wherein said first means includes means responsive to said amplified received PCM NRZ signals for storing energy when said first means operates in said first mode, said first means using said first mode energy stored in said energy storing means for controlling said amplifying means when said first means operates in said second mode.

9. The amplifier of claim 8 wherein the first means energy storing means is a negative peak detector which stores the negative most excursions of said amplified received PCM NRZ signals when said first means operates in said first mode.

10. The amplifier of claim 1 wherein said second means includes means responsive to said amplified received PCM NRZ signals for storing energy related to the most positive excursions of said amplified received PCM NRZ signals, said second means using said stored energy for decreasing said amplifying means controllable gain when said ones bits having an amplitude above a predetermined threshold are in said received PCM NRZ signals.

11. The amplifier of claim 10 wherein said means included in said second means is a positive peak detector.

12. An amplifier for received pulse code modulation nonreturn-to-zero (PCM NRZ) signals comprising:
   a) means having a controllable gain for amplifying said received PCM NRZ signals;
   b) first means responsive to the amplified received PCM NRZ signals for:
      i) operating in a first mode when zeroes bits are in said received PCM NRZ signals to control the DC drift of the amplifying means; and
      ii) operating in a second mode when ones bits are in said received PCM NRZ signals for controlling the amplifying means to have minimal DC shift for the received ones bits as long as after a predetermined number of consecutive ones bits occur in said received PCM NRZ signals at least one zeroes bit occurs in said received PCM NRZ signals; and c) second means responsive to the amplified received PCM NRZ signals for decreasing the amplifying means controllable gain so that the amplified received PCM NRZ signals have essentially a constant output level when ones bits having an amplitude above a predetermined threshold are in said received PCM NRZ signals as long as within a predetermined time interval there occurs at least one ones bit in said received PCM NRZ signals whose amplitude is above said predetermined threshold.

13. The amplifier of claim 12 wherein said NRZ PCM signals are received in frames and said predetermined number of consecutive ones bits are one less than the number of bits in each of said frames and said predetermined time interval is the time interval for each of said frames.

14. The amplifier of claim 12 wherein said first means includes means responsive to said amplified received PCM NRZ signals for storing energy when said first means operates in said first mode, said first means using said first mode energy stored in the energy storing means for controlling said amplifying means when said first means operates in said second mode.

15. The amplifier of claim 14 wherein the first means energy storing means is a negative peak detector which stores the negative most excursions of said amplified received PCM NRZ signals when said first means operates in said first mode.

16. The amplifier of claim 12 wherein said second means includes means responsive to said amplified received PCM NRZ signals for storing energy related to the most positive excursions of said amplified received PCM NRZ signals, said second means using said stored energy for decreasing the amplifying means controllable gain when said ones bits having an amplitude above a predetermined threshold are in said received PCM NRZ signals.

17. The amplifier of claim 16 wherein said means included in said second means is a positive peak detector.

* * * * *